(12) United States Patent
Chang

(10) Patent No.: US 6,827,131 B1
(45) Date of Patent: Dec. 7, 2004

(54) APPARATUS OF WATER-COOLED HEAT SINK

(76) Inventor: Neng Chao Chang, No. 6, Lane 189, Chung Yang Road, Sec. 2, Tu-Cheng City, Taipei (TW)

( * ) Notice: Subject to any disclaimer, the term of this patent is extended or adjusted under 35 U.S.C. 154(b) by 0 days.

(21) Appl. No.: 10/622,731

(22) Filed: Jul. 21, 2003

(51) Int. Cl.[7] .................................................. F28F 7/00
(52) U.S. Cl. ...................... 165/80.4; 165/121; 361/699; 415/175
(58) Field of Search ................................ 165/121, 122, 165/80.4, 126, 127, 80.3, 104.33; 361/697, 699; 257/714; 174/16.1; 415/175–177; 417/199.1, 201, 350, 423.5; 310/266

(56) References Cited

U.S. PATENT DOCUMENTS

| | | | | |
|---|---|---|---|---|
| 3,860,064 A | * | 1/1975 | Murphy | ...................... 165/121 |
| 5,954,124 A | * | 9/1999 | Moribe et al. | ......... 165/104.34 |
| 6,019,165 A | * | 2/2000 | Batchelder | .................. 165/80.3 |
| 6,219,242 B1 | * | 4/2001 | Martinez | ..................... 361/704 |
| 6,263,957 B1 | * | 7/2001 | Chen et al. | ................. 165/80.4 |
| 6,386,276 B1 | * | 5/2002 | Chen et al. | ................. 165/121 |
| 6,600,649 B1 | * | 7/2003 | Tsai et al. | .................... 361/697 |
| 6,668,911 B2 | * | 12/2003 | Bingler | ...................... 165/80.4 |
| 6,720,688 B1 | * | 4/2004 | Schiller | ....................... 310/64 |

\* cited by examiner

*Primary Examiner*—Tho Duong
(74) *Attorney, Agent, or Firm*—Rosenberg, Klein & Lee

(57) ABSTRACT

An apparatus of water-cooled heat sink comprising a motor means comprising a motor seat having a room pivoting with a first magnet which both end of it have two rods, a first rod and a second rod, over the room and at the front of first magnet having a coil at the outside of room; a fan means comprising a fan seat and a plurality of cooling blades wherein the fan seat couples to the first rod and the cooling blades couple to the front of first rod of motor seat, the fan seat has a circular hollow room depositing a second magnet in it; a water-cooled means comprising a seat, a plurality of water-cooled blades and a pipeline.

6 Claims, 4 Drawing Sheets

APPARATUS OF WATER-COOLED HEAT SINK

BACKGROUND OF THE INVENTION

1. Field of the Invention

The present invention relates to a heat sink, more particularly, and to a water-cooled heat sink which could decrease the elements and shrink the space and reduce the use of electricity.

2. Description of the Related Art

Presently, the computing speed of CPU or peripheral chip is faster than the past generation resulting in the problems of cooling. And, the water-cooled way is the best cooling method in the present. The conventional heat sink comprises a cooling means, a water-cooled cyclical means and a fan. The water-cooled cyclical means has a motor for providing the power of cycle, and the fan has a motor. Therefore, the volume of the heat sink increases because of amounts of parts and the electricity may increase. So, it is a problem to use the heat sink which has a large size and wasting electricity.

SUMMARY OF THE INVENTION

It is an object of the present invention to provide an apparatus of water-cooled heat sink which discloses a small size of heat sink reducing the elements.

It is another object of the present invention to provide an apparatus of water-cooled heat sink which discloses a saving electricity of means for elevating the economic effect.

To achieve the above mentions, the present invention comprises a motor means including a motor seat for depositing a motor and a first rod of front of motor over the both side of motor seat and the both side of motor individually coupling to a cooling fan and a water-cooled cyclical means. The cooling fan is powered by connecting to the rod of motor. The water-cooled cyclical means comprises a cyclical pipeline and a plurality of water-cooled blades wherein the inside of pipeline fills with water or cooling liquid. The water-cooled blades connect to the second rod of the rear of motor and power the cycle of cooling liquid or water. So, the present invention is provided the power of cooling blades and cyclical means by one motor. Therefore, using one motor in the cooling blades and cyclical means reduces one motor for decreasing the space to place the elements and further saving the electricity.

BRIEF DESCRIPTION OF THE DRAWINGS

The accompanying drawing is included to provide a further understanding of the invention, and is incorporated in and constitutes a part of this specification. The drawing illustrates an embodiment of the invention and, together with the description, serves to explain the principles of the invention. In the drawing.

FIG. 3 is a sectional view showing the heat sink of the present invention;

FIG. 4 is a side perspective view showing the heat sink of the present invention; and.

DETAILED DESCRIPTION OF THE PREFERRED EMBODIMENTS

Figure 1:
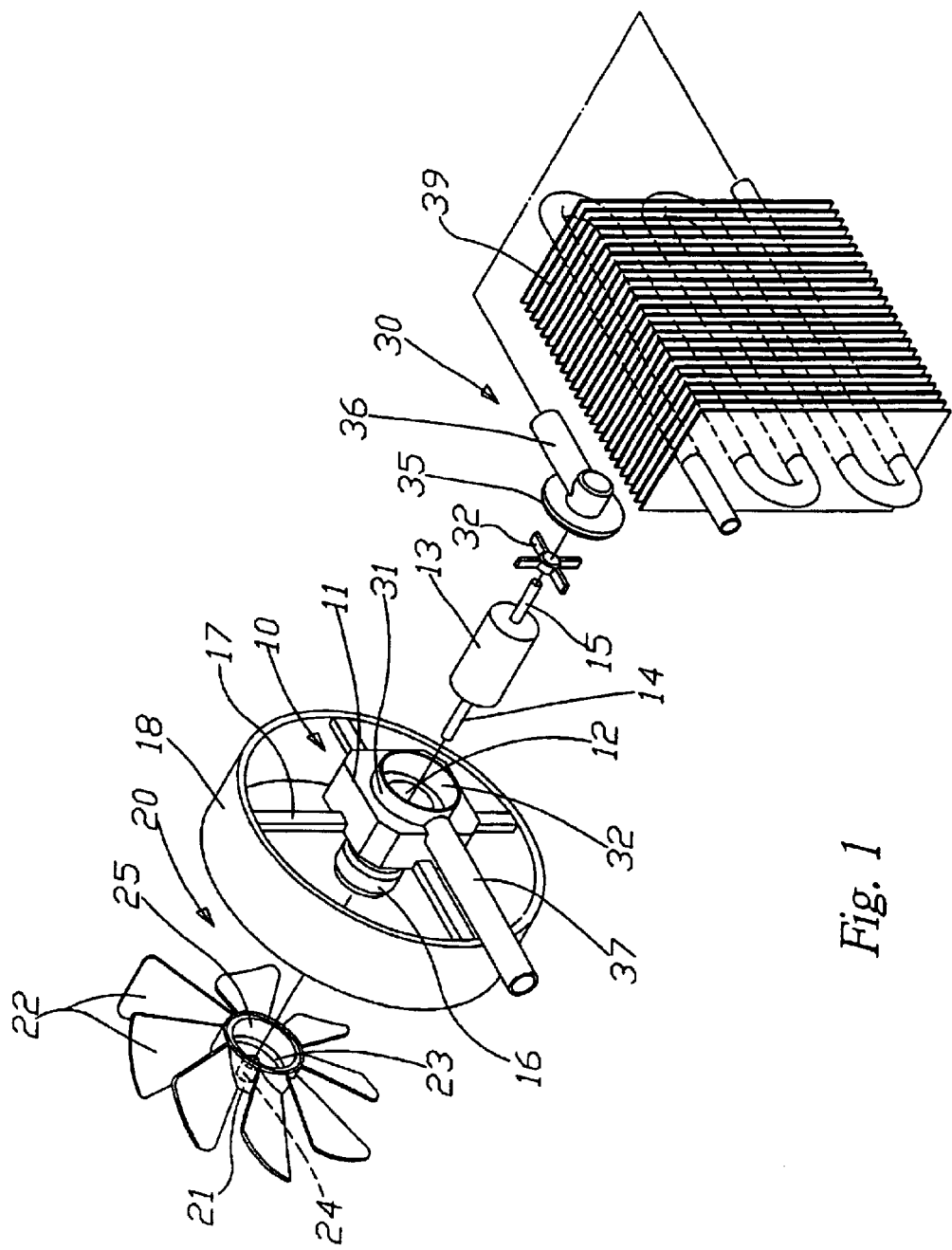
FIG. 1 is an explosive view showing the heat sink of the preset invention.

Reference will now be made in detail to the preferred embodiments of the present invention, examples of which are illustrated in the accompanying drawings. Wherever possible, the same reference numbers are used in the drawings and the description to refer to the same or like parts.

Figure 2:
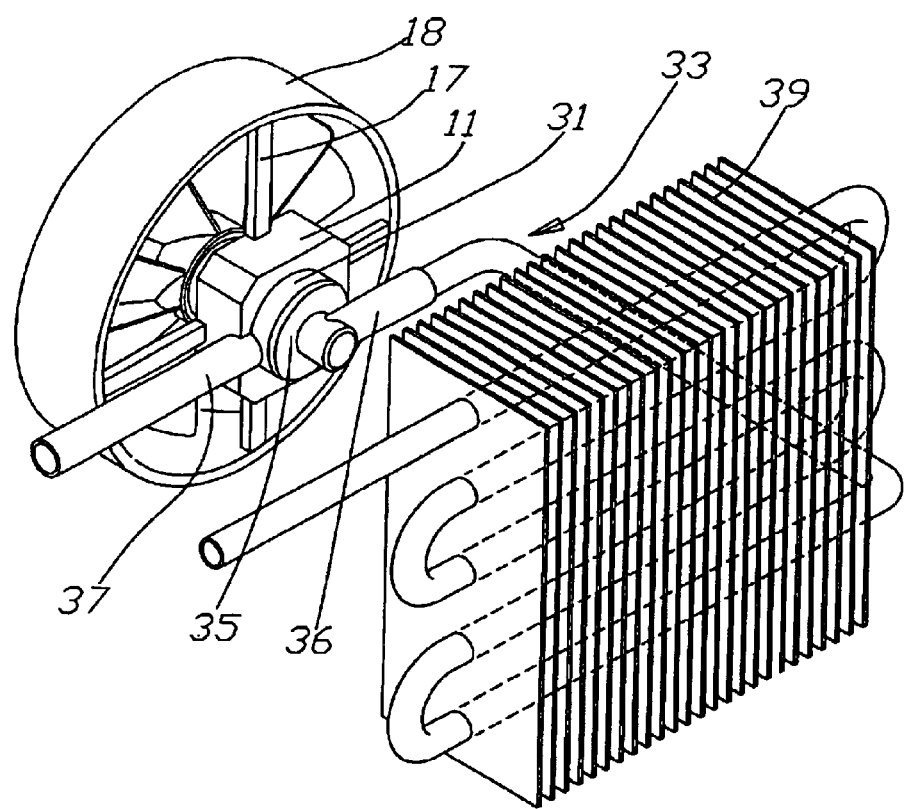
FIG. 2 is an illustrate view showing the heat sink of the present invention.
Figures 3, 4:
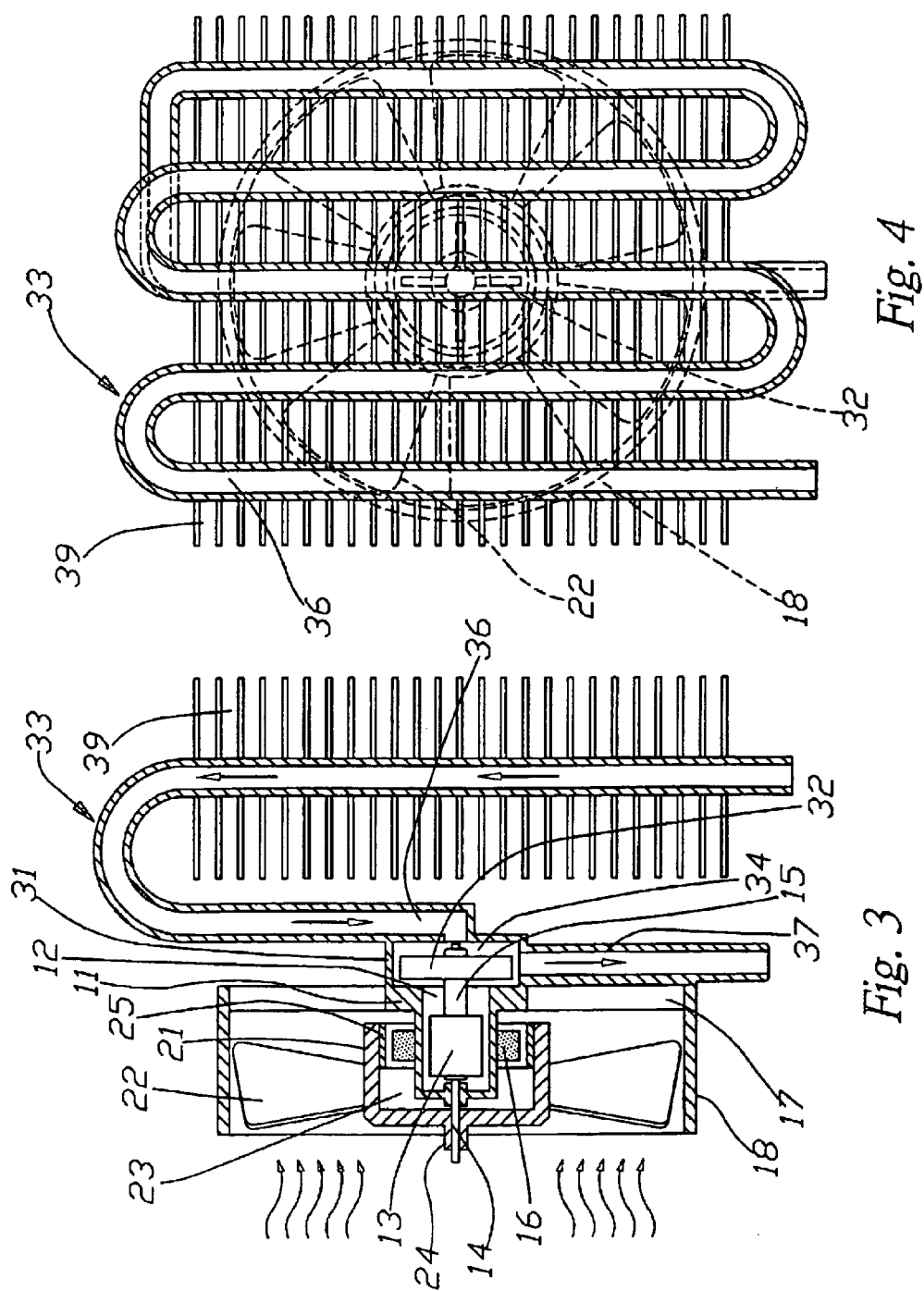

Refer to FIGS. 1 to 3, a water-cooled heat sink of the present invention comprises a motor means 10, a cooling fan means 20 and a water-cooled means 30. The motor means 10 comprises a motor seat 11 having a room 12 which pivotal couples to a first magnet 13 having a first rod 14 and a second rod 15 at both end side over the room 12 and a coil 16 at the circumference of the first magnet 13. Further, the motor seat 11 is surrounded by a supporting means 17 which deposits a frame 18 at the outside.

The fan means 20 comprises a fan seat 21 and a plurality of cooling blades 22 wherein the fan seat 21 has a circular hollow room 23 having a pin 24 which pivotal connects to the first rod 14 of magnet 13 and the room 23 could deposit with the flange of motor seat 11. The circumference of the room 23 deposits a second magnet 25 opposed to the coil 16.

The water-cooled means 30 comprises a seat 31, a plurality of water-cooled blades 32 and a pipeline 33. The seat 31 is opposite to the fan means 20 to deposit and is made one-shooting with the motor seat 11. The seat 31 has a chamber 34 neighboring or connecting to the room 12 of motor seat 11 for placing the water-cooled blades 32 and the fluid flowed, and the side of seat 31 deposits a cover 35. The blades 32 pivots to the second rod 15 of first magnet 13 and is powered by the second magnet 13. The pipeline 33 comprises an inlet 36 and an outlet 37 connecting each others and the chamber 34 for forming a cyclical path.

Figure 5:
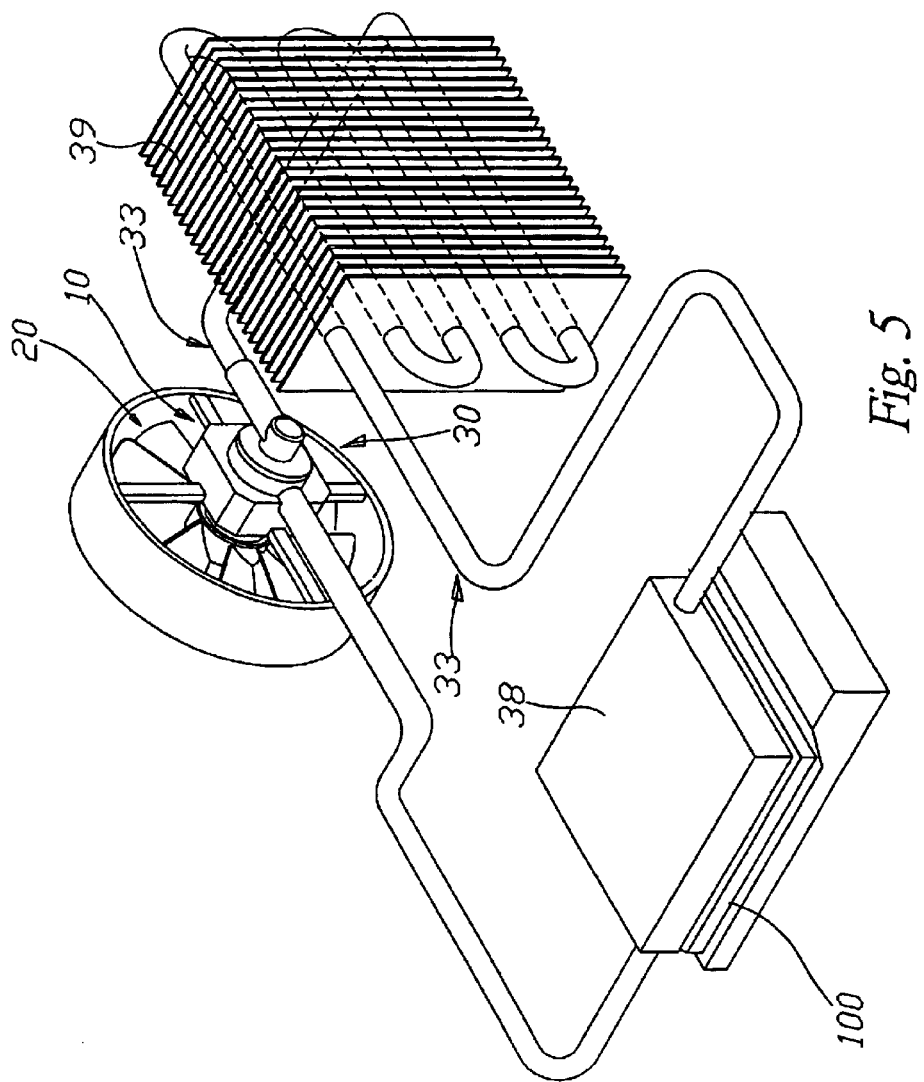
FIG. 5 is an illustrate view showing the heat sink connecting to the CPU and heat exchange of the present invention.

Further, refer to FIGS. 4 and 5, the pipeline 33 connects between a cooling apparatus 38 and a heat exchange 39 wherein the apparatus 38 is for cooling a CPU 100 and the heat exchange 39 is for cooling a fluid in the pipeline 33.

The heat sink of the present invention comprises the motor 10 only using one coil 16. When power up, the first magnet 13 and second magnet 25 can generate induction with the coil to operate at the same time and individually power the cooling blades 22 and the water-cooled blades 32 to generate a function of water-cooled and air-cooled.

Further, the heat sink of the present invention discloses only using one motor depositing the motor seat of motor means. The motor comprises two rods for powering the cooling blades and the water-cooled blades for providing the power of cooling blades and water-cooled blades.

Therefore, the foregoing is considered as illustrative only of the principles of the invention. Further, since numerous modifications and changes will readily occur to those skilled in the art, it is not desired to limit the invention to the exact construction and operation shown and described, and accordingly, all suitable modifications and equivalents may be resorted to, falling within the scope of the invention.

What is claimed is:

1. An apparatus of water-cooled heat sink comprising:

a motor means comprising a motor seat having a room pivoting with a first magnet which both end of the first magnet have two rods, a first rod and a second rod, extending over the room and at the circumference of first magnet having a coil at the outside of room;

a fan means comprising a fan seat and a plurality of cooling blades wherein the fan seat couples to the first rod and the cooling blades couple to the circumference of the fan seat, the fan seat has a circular hollow room depositing a second magnet in the circular hollow room;

a water-cooled means comprising a seat, a plurality of water-cooled blades and a pipeline wherein the seat deposits the side of motor means opposed to the fan means and has a chamber, and the water-cooled blades connects to the second rod at the rear of first magnet in the chamber, and the pipeline includes an inlet and outlet to connect to the chamber for forming a cyclical path.

2. The apparatus of water-cooled heat sink as claim 1, wherein the outside of motor seat comprises a supporting means and the end of the supporting means has a frame.

3. The apparatus of water-cooled heat sink as claim 1, wherein the circular hollow room has a pin for pivotally connecting to the first rod of first magnet.

4. The apparatus of water-cooled heat sink as claim 1, wherein a side of seat is sealed by a cover.

5. The apparatus of water-cooled heat sink as claim 1, wherein the pipeline couples to a cooling apparatus for cooling a CPU.

6. The apparatus of water-cooled heat sink as claim 1, wherein the pipeline couples to a heat exchange.

* * * * *